United States Patent [19]

Ishizawa et al.

[11] Patent Number: 4,910,442
[45] Date of Patent: Mar. 20, 1990

[54] FIELD EMISSION TYPE ELECTRON GUN

[75] Inventors: Yoshio Ishizawa; Chuhei Oshima; Susumu Aoki, all of Ibaraki, Japan

[73] Assignee: National Institute for Researches in Inorganic Materials, Ibaraki, Japan

[21] Appl. No.: 266,287

[22] Filed: Oct. 27, 1988

Related U.S. Application Data

[63] Continuation of Ser. No. 810,190, Dec. 18, 1985, abandoned.

[30] Foreign Application Priority Data

Jan. 25, 1985 [JP] Japan .................................. 60-013265

[51] Int. Cl.⁴ ......................... H01J 29/58; H01J 29/46
[52] U.S. Cl. ..................................... 315/382; 313/449
[58] Field of Search ........................... 315/382, 10, 14; 313/447, 448, 449, 336, 341

[56] References Cited

U.S. PATENT DOCUMENTS 3,250,936  5/1966  Pua ..................................... 313/449
3,659,135  4/1972  Van Roosmalen ................. 313/448
3,869,636  3/1975  Lawrence ........................... 313/449
3,890,533  6/1975  Tanaka ................................ 313/447
4,019,077  4/1977  Sakifani .............................. 313/336

Primary Examiner—Theodore M. Blum
Assistant Examiner—Gregory C. Issing
Attorney, Agent, or Firm—Oblon, Spivak, McClelland, Maier & Neustadt

[57] ABSTRACT

A field emission type electron gun comprises a cathode, an anode placed opposing the cathode, a filament placed obliquely above the anode in a space between the cathode and anode to heat the anode, a control electrode and a vacuum container housing the cathode, the anode the control electrode and the filament. The anode has an elongated body with a through hole at its center, the control electrode is provided near the anode, and means for rendering the electric potential of the control electrode to be negative to the electric potential of the anode is provided to concentrate an electron beam to the top end of the anode.

5 Claims, 1 Drawing Sheet

FIELD EMISSION TYPE ELECTRON GUN

This application is a continuation of application Ser. No. 810,190 filed Dec. 18, 1985 now abandoned.

BACKGROUND OF THE INVENTION

1. Field of the Invention

The present invention relates to a field emission type electron gun useful for e.g. electron beam exposure devices or electron beam devices for high brightness.

2. Description of the Prior Art

A typical conventional field emission type electron gun is illustrated in FIG. 1, wherein a Butler's anode is employed as the anode. A filament 4 for heating a first anode 2 to generate a gas is disposed obliquely above the first anode 2. A cathode 1 and a second anode 3 are housed in a vacuum container 5 together with the first anode 2 and the filament 4.

In such an electron gun, when the first anode 2 is heated by the filament 4, the temperature of the surface of the first anode 2 is not so high, whereby generation of gas from the first anode is insufficient. As a result, although adsorbed molecules (e.g. water) having a small binding energy can be removed, oxygen atoms having strong bond strength will be retained on the surface of the first anode 2. Accordingly, with an increase of the emission current, there will be an increase in the probability of the liberation or ionization of the adsorbed gas caused by excitation of electrons. The liberated molecules, atoms or ions are likely to be absorbed or impinge on the surface of the cathode 1, and thus tend to change the work function of the electron emitting surface and to change the shape of a tip. Thus, there has been a difficulty that the emission current tends to be unstable.

In order to eliminate the above-mentioned difficulty, there has been proposed an electron gun as disclosed in U.S. Pat. No. 4,596,942. As shown in FIG. 2, an anode is formed by a horn-shaped plate in which a central opening portion is raised instead of the conventional Butler's anode, and a filament 4 is placed immediately before the first anode 2 of the horn-shaped plate in a symmetrical manner so as to serve as a gas expelling member and an anode. However, this electron gun has the problem that the process of expelling of gas cannot be completed, although some gas expelling can be attained through the raised portion at the center of the anode.

The inventors of the present application have got an idea, after further study, that an anode is formed to have an elongated shape in which a through hole is formed at its center, whereby gas is effectively and thoroughly expelled from the anode. However, when an anode having an elongated shape is used, some electrons emitted from the cathode may take orbits out of the anode to impinge on the base portion of the anode (as shown in FIG. 3(a)) to thereby cause the liberation or ionization of adsorbed gas due to excitation of the electrons. As a result, there produces an unstable emission current.

The present invention has been attained by finding that a stable emission current can be obtained by providing a control electrode near an anode or between an anode and a cathode and by rendering the electric potential of the control electrode to be negative to that of the anode, whereby electrons emitted from the cathode are converged at the top end of the anode by the control electrode and impinging of the electrons on the lower base portion of the anode is prevented. Further, the filament sufficiently functions to expel gas from the top portion of the anode.

SUMMARY OF THE INVENTION

It is an object of the present invention to provide a field emission type electron gun capable of generating an extremely stable emission current while it has a simple structure.

The foregoing and the other object of the present invention have been attained by providing a field emission type electron gun which comprises a cathode, an anode placed opposing the cathode, a filament placed obliquely above the anode in a space between the cathode and anode to heat the anode and a vacuum container housing the cathode, the anode and the filament, wherein the anode has an elongated shape with a through hole at its center, a control electrode is provided near the anode in the vacuum container, and means for rendering the electric potential of the control electrode to be negative to the electric potential of the anode is provided to concentrate an electron beam at the top end of the anode.

DETAILED DESCRIPTION OF THE PREFERRED EMBODIMENT

Preferred embodiments of the present invention will be described with reference to drawing.

Figure 1:
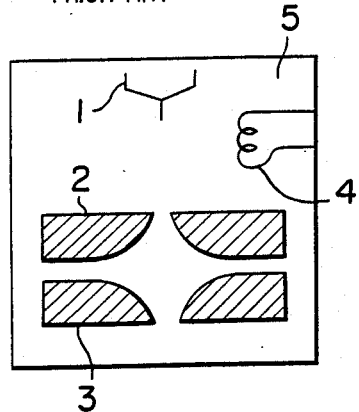
FIG. 1 is a schematic cross-sectional view of a conventional field emission type electron gun.
Figure 2:
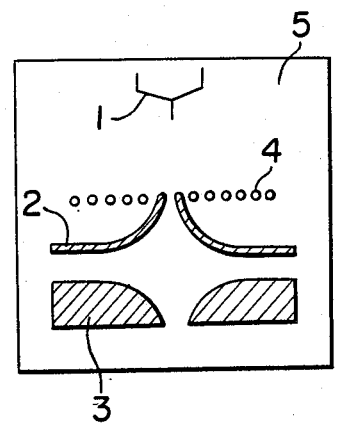
FIG. 2 is a schematic cross-sectional view showing an improved field emission type electron gun.
Figure 3A:
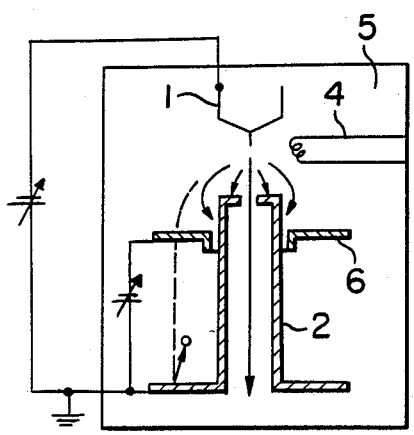
FIG. 3(a) is a cross-sectional view of an embodiment of the field emission type electron gun according to the present invention.

FIG. 3(a) illustrates an embodiment of the present invention.

A cathode 1 is placed in a vacuum container 5 so as to emit an electron beam downwardly in the figure. An anode 2 is also placed opposing the cathode 1 in the vacuum container 5. The anode has an elongated body in which a through hole is formed in the longitudinal direction of the body and an aperture is formed at the top end of the body so as to be communicated with the through hole. The anode is placed in such a manner that the longitudinal axis of the through hole in the elongated body coincides with the electron beam from the cathode through the aperture. The anode 2 is provided with a flange outwardly extending from the lower end of the elongated body of the anode 2.

A generally disk-like control electrode 6 is fitted to the outer cylindrical surface of the elongated body of the anode 2 so that it prevents electrons from scattering toward the lower base portion of the anode and only the top end portion of the anode can be sufficiently heated by a filament 4 which is placed obliquely above the anode 2.

The vacuum container 5 is kept at at least $10^{-10}$ Torr. In order to converge the electron beam at the top end of the anode 2, a circuit including a power source is connected to the control electrode, the cathode and the anode in such a manner that the electric potential of the control electrode and the cathode is negative to that of the anode, as shown in FIGS. 3(a) and (b). With the above-mentioned circuit, the control electrode is maintained at the negative potential to the anode. For instance, electrons emitted from the cathode 1 can be easily converged or concentrated at the top end of the anode 2 by appling a voltage of −1500 V to the cathode and a voltage of −500 V to the control electrode, while the anode is grounded.

Figure 3B:
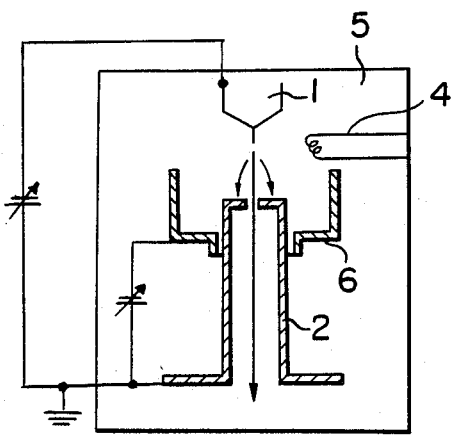
FIG. 3(b) is a cross-sectional view of another embodiment of the present invention.

FIG. 3(b) shows another embodiment of the present invention. In FIG. 3(b), a control electrode 6 is formed to be in generally cup-like shape by stamping operation of a conductive plate. The bottom of the cup-like control electrode is perforated so as to correspond to the outer diameter of the elongated body of the anode 2. The cup-like control electrode 6 is fitted to the elongated body so that the circular wall portion formed at the circular edge of the bottom extends toward the cathode 1, namely, between the top of the anode 2 and the cathode 1.

As described above, in accordance with the present invention, an anode is formed to have an elongated body at the central portion; a control electrode is provided near the elongated body of the anode or between the cathode and the anode, and the control electrode is maintained at a negative potential to the anode. Accordingly, electrons emitted from the cathode are concentrated and converged at the top end of the elongated body and liberation or ionization of gas can be minimized, whereby a stable emission current can be obtained.

What is claimed is:
1. A field emission type electron comprising:
a cathode,
an anode placed opposite to said cathode,
a filament placed obliquely above said anode in a space between said cathode and anode to heat said anode, and
a vacuum container housing said cathode, said anode and said filament,
wherein said anode has a hollow elongated cylindrical body with a through hole at its center and a flange extending outwardly from the lower end of said hollow elongated body, wherein a control electrode is mounted on the cylindrical surface of said anode closer to the top end of said anode than the lower end in said vacuum container to prevent electrons from scattering toward the lower portion of said anode and heating of the lower portion of the anode, wherein means for rendering the electric potential of said control electrode to be negative with regard to the electric potential of said anode and positive with respect to said cathode is provided, whereby an electron beam is converged at the top end of said anode and the liberation and ionization of gas is minimized and wherein said anode has a longitudinal axis which coincides with said electron beam.

2. A field emission type electron gun according to claim 1, wherein said control electrode is in a generally disk-like shape.

3. A field emission type electron gun according to claim 1, wherein said control electrode is in a generally cup-like shape and the circular wall portion extends toward said cathode.

4. A field emission type electron gun according to claim 1, wherein said means for rendering the electric potential is a circuit including a power source connected to said control electrode, said cathode and said anode.

5. A field emission type electron gun according to claim 4, wherein said anode is grounded and said cathode and said control electrode are connected to a negative potential.

* * * * *